March 25, 1969 W. E. ALLEN 3,435,328

ELECTRONIC SOLAR CELL ARRAY SIMULATOR

Filed Jan. 9, 1967 Sheet 1 of 2

WALTER E. ALLEN
INVENTOR

BY

J. O. Tresansky
ATTORNEY

WALTER E. ALLEN
INVENTOR
BY
J. O. Tresansky
ATTORNEY 3,435,328
Patented Mar. 25, 1969

3,435,328

ELECTRONIC SOLAR CELL ARRAY SIMULATOR

Walter E. Allen, Beltsville, Md., assignor to the United States of America as represented by the Secretary of the Navy Filed Jan. 9, 1967, Ser. No. 608,222
Int. Cl. G05f *1/60;* H02p *13/16;* G01r *7/02*
U.S. Cl. 323—8 10 Claims

ABSTRACT OF THE DISCLOSURE

Method and apparatus for accurately simulating, electronically, the electrical characteristics of any size solar cell array at any desired array temperature and solar incidence angle. A darkened, temperature controlled solar cell is employed as a control element and is effectively illuminated by a shunt connected programmable constant current supply, such that the basic current-voltage characteristics of an illuminated solar cell are produced. Circuitry is provided for taking into account the number of solar cells that are connected in series and parallel in the array being simulated.

Generally speaking, the present invention relates to electronic simulators and, more particularly, it pertains to an improved method and apparatus for accurately simulating, electronically, the electrical characteristics of any size solar cell array at any desired array temperature and solar incidence angle.

It has heretofore been common practice to simulate solar array power inputs to satellites during thermal vacuum tests. In many instances, a constant current supply is used to simulate a solar cell array and this practice has merit when the solar array voltage is limited by the effective load to a maximum of approximately 0.4 volt per series solar cell. Under these conditions, the current output of such a constant current supply may be easily programmed to simulate the predicted performance of the array in any given orbit. Unfortunately, however, this procedure is completely inadequate, for example, on satellites employing series regulators which operate over a very broad range of solar array voltages.

Furthermore, active temperature control systems, in particular, which presently employ a separate solar cell array, require a more precise simulation of solar array characteristics than was heretofore possible since they present large impedance changes to the solar array commensurate with thermal demands. In other words, the attempts so far to simulate the current-voltage characteristics of a solar array under the changing illumination conditions experienced in orbit have met with limited success and, at best, have been approximations over a limited voltage range.

These prior attempts at accurately simulating the response of a solar cell array have been inadequate primarily because of the fact that the electrical characteristics of a solar cell are somewhat unique and cannot readily be duplicated by any device or combination of devices other than another solar cell. Consequently, it is proposed in accordance with the present invention to use a reference solar cell as a control element. However, the reference solar cell is not actually illuminated, but instead, effective illumination of this reference solar cell is provided by an adjustable or programmable constant current supply whose output voltage is clamped by the reference solar cell voltage. As will be pointed out in more detail hereinafter, the current-voltage characteristic of the darkened solar cell has substantially the same configuration as, except that it is displaced from, that of a normally illuminated solar cell. In other words, the darkened solar cell reduces the output current from the adjustable or programmable constant current source by an amount dependent upon the existing operating point on the darkened cell characteristic curve at which the simulator is operating. This causes the combination of the darkened solar cell and programmable current source, hereinafter referred to as the reference cell unit, to have electrical characteristics identical to an illuminated solar cell. The effect of temperature is introduced in the reference cell unit by maintaining the reference or darkened solar cell at the desired temperature in a temperature controlled oven. The reference cell unit will, as a result, provide the basic electrical characteristics of a single solar cell at any desired illumination intensity (or incidence angle) and array temperature.

Power to the satellite load is furnished by a separate constant current supply whose output current is provided with a variable current shunting path. The reference cell unit is electronically loaded by a proportional current control which samples the satellite load current and then draws current from the reference cell unit, such that the current drawn from the reference cell unit is equal to the satellite load current divided by the number of solar cells connected in parallel in the array being simulated, under all satellite loading conditions. The simulated array or load voltage, on the other hand, is first divided by the number of series cells in the array, by a voltage divider network, and this voltage is then compared to the reference cell unit voltage. If the simulated per cell voltage is not in agreement with the reference cell unit voltage, feedback is effected to adjust the shunt current until the current and voltage, on a per cell basis from the simulated array, are in direct agreement with the reference cell unit. In this manner, the response of any size array, at any operating temperature and in any orbit for which the solar incidence angle to the array is predictable, may be accurately simulated.

In view of the foregoing, one object of the present invention is to provide an improved method and apparatus for simulating the response of a solar cell array.

Another object of the present invention is to provide an improved method and apparatus for accurately simulating the response of any size solar cell array to variations in temperature and solar incidence angle.

Another object of the present invention is to provide an improved method and apparatus, employing a darkened solar cell as a reference or control element, to accurately simulate the response of an operational solar cell array, during a wide range of variations in the operating temperature and solar incidence angle, when in space.

Other objects, purposes and characteristic features of the present invention will in part be pointed out as the description of the invention progresses and in part be obvious from the accompanying drawings, wherein.

Figure 1:
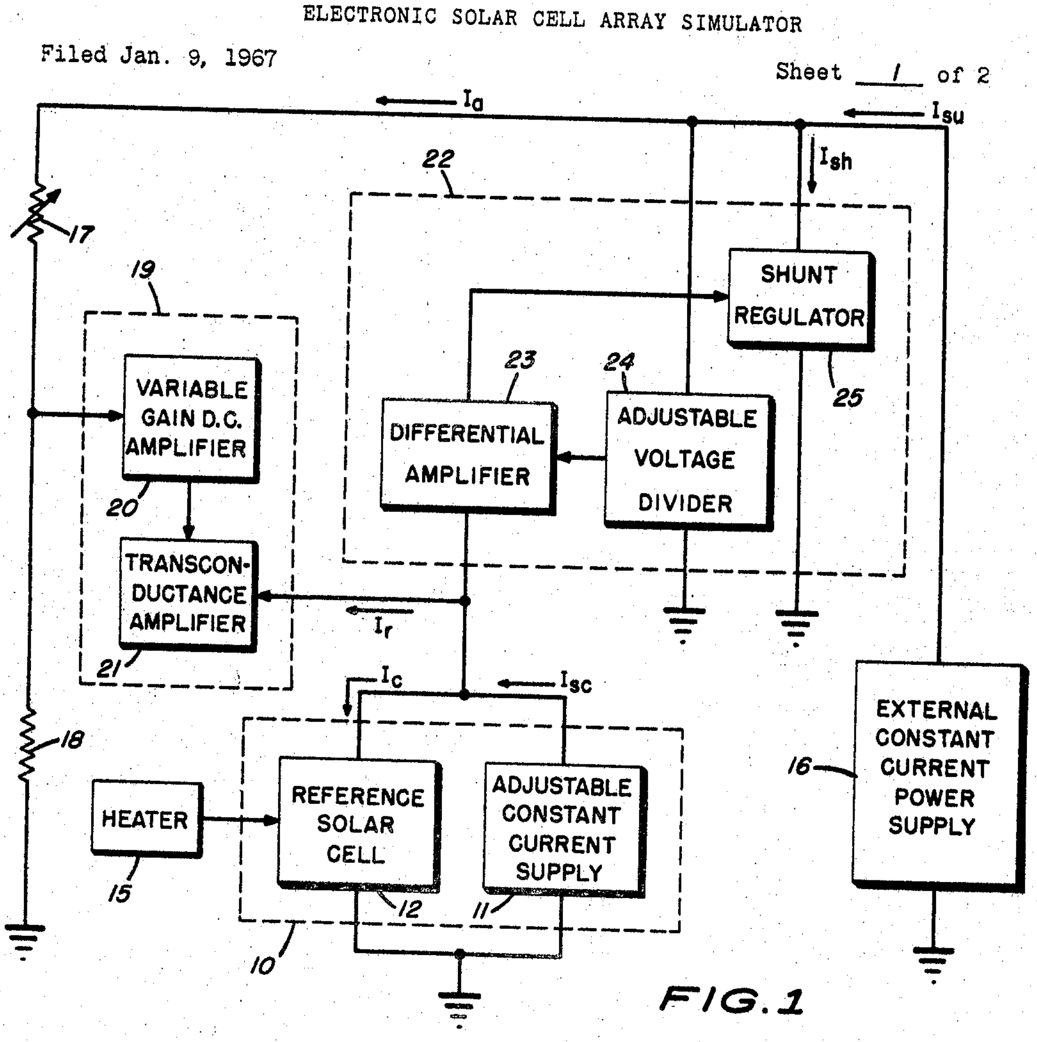
FIG. 1 is a simplified block diagram of a solar cell array simulator according to one embodiment of the present invention.

Referring now to the block diagram of FIG. 1, the reference cell unit 10 includes an adjustable constant current source 11 and a reference solar cell 12 connected in circuit multiple such that the solar cell 12 loads the constant current source 11. As mentioned previously, the reference solar cell 12 is not actually illuminated but, instead, loads the constant current source 11 in such a manner that the solar cell 12 is effectively illuminated by the current source 11; i.e., the electrical characteristics of the reference cell unit 10 are substantially the same as the electrical characteristics of an illuminated solar cell while in space.

Figure 2:
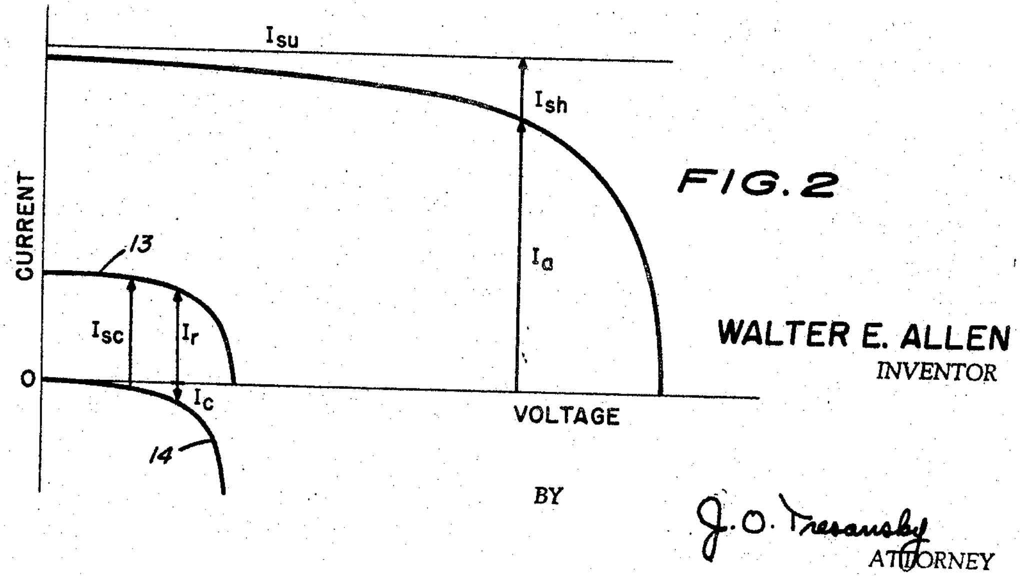
FIG. 2 is a graph illustrating the electrical characteristics of the solar cell array simulator shown in FIG. 1.

More particularly, the electrical characteristics of the reference cell unit 10 are represented by the curve 13, in FIG. 2; whereas, the electrical characteristics of the darkened solar cell 12 are represented by the curve 14. These current-voltage characteristic curves 13 and 14 are identical in shape; the only difference between them being that the curve 14 for the darkened solar cell 12 is shifted down below the voltage axis. The output voltage of the current source 11 is thus clamped by the darkened solar cell voltage and, as shown in FIGS. 1 and 2, the darkened solar cell 12 moreover reduces the output current $I_{sc}$ from the source 11 by an amount $I_c$. This causes the reference cell unit 10 to have electrical characteristics identical to that of an illuminated solar cell.

As previously mentioned, the constant current source 11 is programmed or otherwise adjusted to provide an output current $I_{sc}$ whose magnitude varies in proportion to the known or predictable manner in which solar illumination will be received by the array being simulated, while in space. In other words, the output current $I_{sc}$ from the constant current source 11 would be varied in accordance with solar illumination intensity or incidence angle. Moreover, as shown in FIG. 1, a suitable temperature controlled oven or heater 15 is operably connected to maintain the reference solar cell 12 at any desired temperature. As a result, the reference cell unit 10 will provide the basic electrical characteristics of a single solar cell at any desired illumination intensity or incidence angle and array temperature.

A suitable second or external constant current power supply 16 (having an output current $I_{su}$) is connected to apply load current $I_a$ to the satellite load represented by the variable resistance 17. This load current $I_a$ is monitored by a relatively small value resistor 18, connected in series with the load 17, and causes a proportional voltage to be developed (across resistor 18) and applied to a current divider network 19 comprising, a variable gain D.C. amplifier 20 and a transconductance amplifier 21. As will be pointed out in more detail hereinafter, the transconductance amplifier 21 functions to draw a controlled amount of current $I_r$ from the reference cell unit 10, equal to the value of load current $I_a$ divided by the number of solar cells connected in parallel within the solar cell array to be simulated by the illustrated apparatus of the present invention. At this effective cell current $I_r$, a corresponding cell voltage will be developed at the output of the reference cell unit 10.

The load voltage which results from the flow of load current $I_a$ is applied to a suitable voltage comparator network 22 comprising, differential amplifier 23, adjustable voltage divider 24 and shunt regulator circuit 25. The voltage divider 24 is adjusted to divide this load voltage in accordance with the known number of solar cells that are connected in series in the solar cell array to be simulated. The voltage output from the divider 24 is then applied, along with the voltage output from the reference cell unit 10, to the differential amplifier 23 which produces an output signal proportional to any difference between these two input voltages. This output from the differential amplifier 23 is, in turn, employed to control the shunt regulator network 25 in such a manner that a proper amount of current $I_{sh}$ is shunted away from the satellite load 17, as necessary to make the two input voltages to the differential amplifier 23 equal. The final result is that both the load current and load voltage are always fixed multiples respectively of the current and voltage from the reference cell unit 10; i.e., the load current and voltage are the same as would be supplied to the load 17 by an actual solar cell array when in space.

Figure 3:
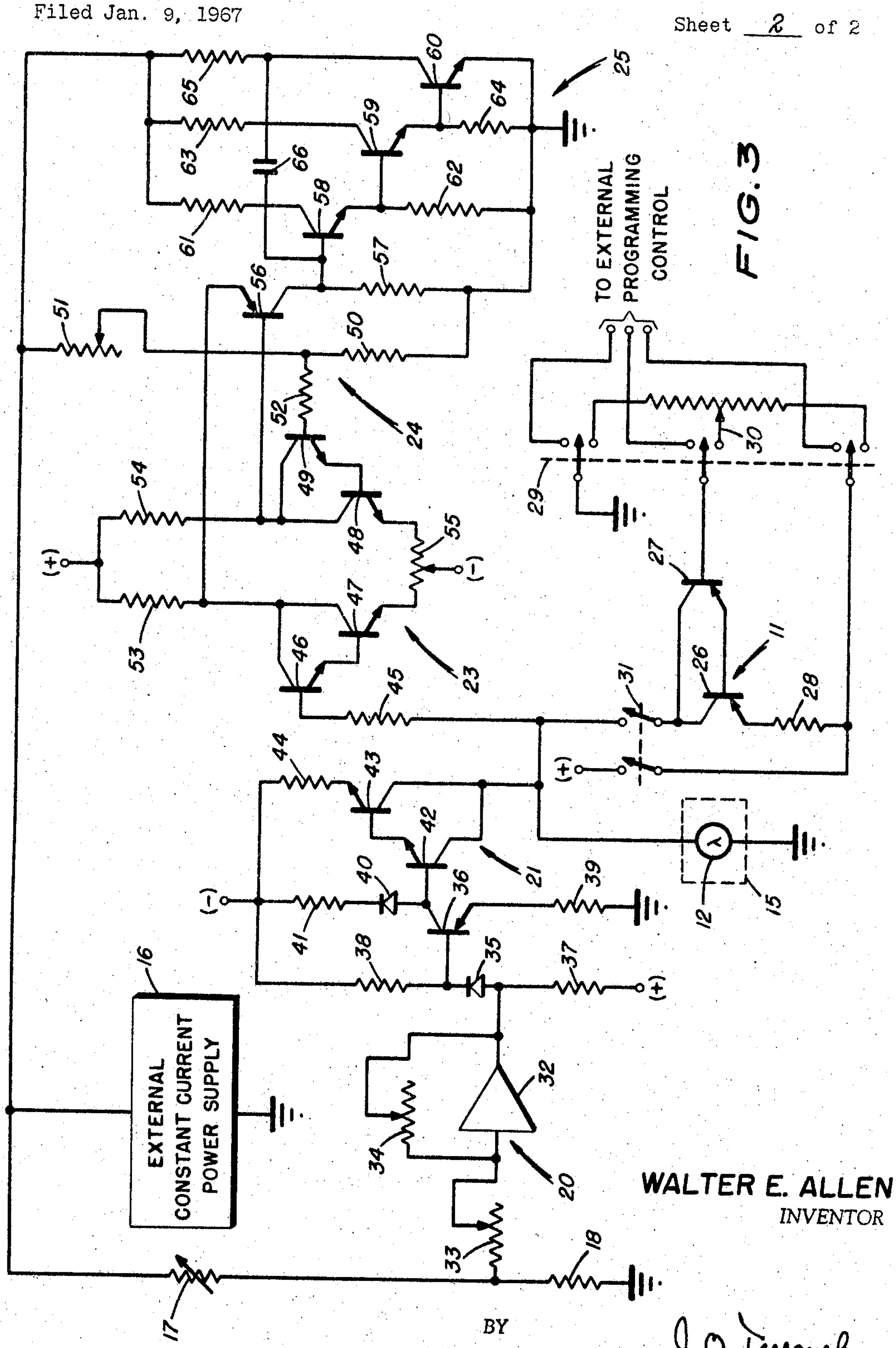
FIG. 3 is a detailed circuit diagram of the solar cell array simulator of FIG. 1.

Referring now to the detailed schematic of FIG. 3, the adjustable contact current source 11 includes a transconductance amplifier stage made up of transistors 26 and 27. These transistor stages 26 and 27 function, in a well-known manner, to cause the current through emitter resistor 28 (current $I_{sc}$ in FIGS. 1 and 2) to be a linear function of the voltage applied at the base of transistor stage 27. As shown in FIG. 3, the base voltage of transistor stage 27 is controlled in accordance with the position of switch 29; i.e., in the lower or down switch position, the voltage applied to the base of transistor 27 is manually variable in accordance with the adjusted position of potentiometer arm 30, whereas, in the upper position of switch 29, the voltage applied to the base of transistor 27 is controlled by external programming means (not shown). As mentioned previously, this control voltage applied to the base of transistor 27 is preferably varied in accordance with the manner (intensity and/or incidence angle) in which solar illumination would be received by the solar cell array being simulated.

A current on-off switch 31 is connected to apply emitter voltage to the transconductance amplifier 26–27 and to furthermore connect the darkened solar cell 12 in multiple with the variable constant current source formed by this transconductance amplifier stage. Moreover, in FIG. 3, the darkened solar cell 12 is illustrated as being enclosed in a dotted rectangle representing the temperature controlled oven or heater 15.

The load current flowing through satellite load 17 (current $I_a$ in FIGS. 1 and 2) is monitored by sensing the magnitude of the voltage which such current develops across the monitoring resistor 18. This monitored voltage is applied to the variable gain D.C. amplifier stage 20 comprising an operational amplifier 32 which has variable input and output impedances represented by variable resistors 33 and 34 respectively. The gain of the operational amplifier 32 is adjusted, by varying the values of resistors 33 and 34, in inverse proportion with the known number of solar cells connected in parallel within the solar cell array being simulated by the apparatus of the present invention, i.e., if the array being simulated comprises a large number of parallel connected solar cells, the gain of operational amplifier 32 would be adjusted to a relatively low value and vice versa. In other words, the variable gain amplifier stage 20 acts to divide the load current by the number of solar cells connected in parallel in the array being simulated. If desired, the value of resistance 34, for example, can also be externally programmed to provide automatic adjustment of the gain for operational amplifier 32.

The output voltage from the operational amplifier 32 is then applied, via coupling diode 35, to the base of an inverting amplifier stage including transistor 36. Proper biasing of the base of transistor 36 is accomplished by a voltage dividing string including resistors 37 and 38 connected in series between the positive (+) and negative (−) voltage supplies. The emitter of transistor 36 is connected to ground through resistor 39, whereas, its collector is connected, through diode 40 and resistor 41, to the negative (−) supply.

The collector output signal from the inverting amplifier transistor stage 36 is applied to the base of transistor stage 42 which, along with transistor stage 43, forms the transconductance amplifier 21. This transconductance amplifier 21 functions in such a manner that the current through emitter resistor 44 is a linear function of the voltage value applied to the base of transistor 42. It will be noted that the collectors of transistors 42 and 43 are each connected between the output of the adjustable constant current source 11 (the collectors of transistors 26 and 27) and the darkened solar cell 12. Therefore, the transconductance amplifier 21 draws current (the current $I_r$ in FIGS. 1 and 2) from the reference cell unit 10 until it equals the load current divided by the number of solar cells connected in parallel within the solar cell array being simulated.

The reference cell unit voltage appearing at the collectors of transistors 26 and 27 is applied through resistor 45, to one side of a conventional differential amplifier stage 23 comprising, transistors 46, 47, 48 and 49. The other side of the differential amplifier 23 is supplied with voltage from the voltage dividing network 24 comprising, fixed resistor 50 and variable resistor 51. More specifically, the voltage from the voltage divider network 24 is applied through base resistor 52 for transistor 49. The variable resistor 51 is adjusted to cause the voltage applied to the right-hand side of differential amplifier 23 to be equal to the load voltage produced by load current from source 16, divided by the number of series connected solar cells in the solar cell array being simulated.

The collectors of the transistors 46 and 47 are connected to the positive voltage supply (+) through resistor 53; whereas, the collectors of transistors 48 and 49 are connected to the same positive supply (+) through resistor 54. The emitters of transistors 47 and 48 are connected on either side of a potentiometer 55 whose center arm is connected to the negative supply (−) such that the differential amplifier 23 can be balanced, with no input signals applied, by proper adjustment of the potentiometer 55.

The differential amplifier 23 compares the voltages applied through resistors 45 and 52 and thus produces an output difference voltage signal which is subsequently applied, through a suitable emitter follower stage 56, to the shunt regulator network 25. More specifically, the output difference voltage from the differential amplifier 23 is connected between the base and collector of the emitter follower transistor 56 whose emitter resistor 57 is connected to ground. The shunt regulator 25 comprises transistor stages 58, 59 and 60 which are selectively rendered effective, dependent upon the value of the output difference signal from the differential amplifier 23, to shunt varying amounts of current (the current $I_{sh}$ in FIGS. 1 and 2) from the constant current power supply 16 to ground, through resistors 61–62, 63–64 and 65 respectively. In this manner, the shunt regulator 25 adjusts the load voltage until the two inputs to the differential amplifier 23 are equal; i.e., the load voltage is held at a fixed multiple of the reference cell unit voltage, depending upon the number of cells in series in the array being simulated. A feedback capacitor 66 is connected between the collector of transistor stage 60 and the base of transistor stage 58 to provide degenerative feedback in the shunt regulator 25 to suppress any tendency towards oscillation.

In view of the foregoing, it will thus be seen that the current divider network of FIG. 1 operates to maintain the current through satellite load 17 at a fixed multiple of the output current from the reference cell unit 10 dependent upon the number of solar cells connected in parallel within the solar cell array to be simulated; whereas the voltage comparator network 22 is operable to cause the load voltage to remain in proportion to the reference cell unit voltage multiplied by the number of solar cells connected in series within the array being simulated. Consequently, the method and apparatus of the present invention is capable of accurately simulating the in space response of any desired size of solar cell array, over a wide range of variation in the amount of incident solar illumination (or solar incidence angle) and temperature.

What is claimed is:

1. A method of simulating the in-space response of a solar cell used in supplying electrical energy to a spacecraft load, to different values of incident solar illumination, comprising the steps of, adjusting a first constant current source to supply output current whose magnitude varies in accordance with a known manner in which the value of said incident solar illumination varies, loading the output of said first constant current source with a darkened solar cell to produce a reference current and voltage indicative of the electrical characteristics of an illuminated solar cell at said different values of incident solar illumination, energizing said spacecraft load from a second constant current source, and controlling the current through and the voltage across said spacecraft load into agreement with said reference current and voltage respectively.

2. The method specified in claim 1 further including the step of, varying the temperature of said darkened solar cell to cause said reference current and voltage to manifest the effect of varying temperatures upon the electrical characteristics of an illuminated solar cell.

3. The method specified in claim 1 adapted to simulate the in-space response of an array of solar cells and further including the steps of, monitoring the current through said spacecraft load from said second constant current source, dividing said load current in accordance with the known number of solar cells that are connected in circuit parallel within said array to produce a signal proportionate to the load current produced by each solar cell in said array being simulated, adjusting said reference current in accordance with said proportionate signal to agree with the load current produced by each parallel connected solar cell in said array being simulated, dividing the load voltage produced by the load current from said second constant current source in accordance with the known number of solar cells that are connected in circuit series in said array being simulated to produce a proportionate voltage signal, and adjusting the load current from said second constant current source to bring said proportionate voltage signal into agreement with said reference voltage.

4. The method specified in claim 3 further including the step of, varying the temperature of said darkened solar cell to cause said reference current and voltage to manifest the effect of varying temperature on the electrical characteristics of an illuminated solar cell.

5. In a system for simulating the in-space response of a solar cell array when used in supplying electrical energy to a spacecraft load, to different values of incident solar illumination, the combination of, a first constant current source adjustable to supply output current whose magnitude varies in accordance with a known manner in which said incident solar illumination varies, a darkened solar cell connected as a circuit load for said first constant current source to produce a reference current and voltage indicative of the electrical characteristics of an illuminated solar cell at said different values of incident solar illumination, a second constant current source connected to supply current to said spacecraft load, means responsive to the current through said spacecraft load for dividing said load current in proportion to the number of solar cells connected in circuit parallel in said array to be simulated so as to produce a signal proportionate to the load current produced by each parallel connected solar cell in said array being simulated, means responsive to said proportionate signal for adjusting said reference current into agreement with said load current produced by each parallel connected solar cell in said array being simulated, means responsive to the voltage across said spacecraft load for dividing said load voltage in proportion to the number of solar cells connected in circuit series in said array to be simulated so as to produce a voltage signal proportionate to the load voltage produced by each series connected solar cell in said array to be simulated, and means responsive to said proportionate voltage signal and said reference voltage for adjusting the load current to bring said proportionate voltage signal into agreement with said reference voltage.

6. The combination specified in claim 5 further including means operably connected to vary the temperature of said darkened solar cell such that the effect of variable temperature on the electrical characteristics of an illuminated solar cell is manifested by said reference current and voltage.

7. The combination specified in claim 5 wherein said means for dividing said load current includes, a D.C. amplifier operably connected to be supplied with an input voltage proportional to said load current and being effective to furnish an output voltage signal whose magnitude is dependent upon the gain of said D.C. amplifier, a transconductance amplifier operably connected to said first constant current source and to the output of said D.C. amplifier effective to draw current from said first constant current source in proportion to the magnitude of said output voltage signal furnished by said D.C. amplifier, and means operably connected to said D.C. amplifier for adjusting the gain of said D.C. amplifier in inverse proportion to the number of solar cells connected in circuit parallel within said array being simulated.

8. The combination specified in claim 5 wherein said means for adjusting said load current to bring said proportionate voltage signal into agreement with said reference voltage comprises, comparing means responsive to said reference voltage and said proportionate voltage signal produced by said voltage dividing means for producing an output signal indicative of any difference between said reference voltage and said proportionate voltage signal, and a shunt regulator circuit connected to said second constant current source in circuit multiple with said spacecraft load and responsive to the output signal produced by said comparing means for shunting current away from said spacecraft load so as to bring said proportionate voltage signal into agreement with said reference voltage.

9. The combination specified in claim 8 wherein said comparing means includes, a differential amplifier having a first input operably connected to the output of said first constant current source so as to be supplied with said reference voltage, a second input operably connected to said voltage dividing means so as to be supplied with said proportionate voltage signal, and an output connected to said shunt regulator circuit means, said differential amplifier being effective to produce an output signal whose magnitude is in proportion to the difference between said reference voltage and said proportionate voltage signal.

10. The combination specified in claim 8 wherein said shunt regulator circuit means includes a plurality of parallel connected transistor stages adapted to be selectively rendered conductive dependent upon the magnitude of said differential amplifier output signal.

References Cited

UNITED STATES PATENTS 3,325,723 6/1967 Grayson -------------- 323—8

JOHN F. COUCH, *Primary Examiner.*

G. GOLDBERG, *Assistant Examiner.*

U.S. Cl. X.R.

136—89; 250—212; 323—38; 324—158